United States Patent
Koda

(10) Patent No.: US 10,107,025 B2
(45) Date of Patent: Oct. 23, 2018

(54) VEHICULAR OPERATION DETECTING APPARATUS

(71) Applicant: AISIN SEIKI KABUSHIKI KAISHA, Kariya-shi, Aichi-ken (JP)

(72) Inventor: Satoshi Koda, Kariya (JP)

(73) Assignee: AISIN SEIKI KABUSHIKI KAISHA, Kariya-shi, Aichi-ken (JP)

( * ) Notice: Subject to any disclaimer, the term of this patent is extended or adjusted under 35 U.S.C. 154(b) by 93 days.

(21) Appl. No.: 15/378,378

(22) Filed: Dec. 14, 2016

(65) Prior Publication Data
US 2017/0241186 A1 Aug. 24, 2017

(30) Foreign Application Priority Data
Feb. 24, 2016 (JP) .................. 2016-033461

(51) Int. Cl.
*E05F 15/75* (2015.01)
*B60R 25/20* (2013.01)
(Continued)

(52) U.S. Cl.
CPC .......... *E05F 15/75* (2015.01); *B60R 25/2045* (2013.01); *B60R 25/2054* (2013.01);
(Continued)

(58) Field of Classification Search
None
See application file for complete search history.

(56) References Cited

U.S. PATENT DOCUMENTS

2007/0146209 A1* 6/2007 Touge ................ G01S 13/32
343/702
2008/0252303 A1* 10/2008 Kato .................. H03K 17/955
324/661
(Continued)

FOREIGN PATENT DOCUMENTS

CN 103189245 A 7/2013
DE 10 2015 109 006 A1 12/2015
(Continued)

OTHER PUBLICATIONS

U.S. Appl. No. 15/427,690, filed Feb. 8, 2017, Hitoshi Takayanagi.

*Primary Examiner* — Mussa A Shaawat
*Assistant Examiner* — Abdhesh K Jha
(74) *Attorney, Agent, or Firm* — Sughrue Mion, PLLC

(57) ABSTRACT

A vehicular operation detecting apparatus includes: sensors provided side by side in a vehicle, and individually outputting detection signals that change when a detection target comes into contact with or approaches the sensors; a computing unit computing a ratio value which is a value of a ratio of a first detection signal to a second detection signal, which are detection signals of a first sensor and a second sensor that are one and another one of the sensors, respectively; an operational direction detection unit detecting a direction of movement of the detection target from the first sensor toward the second sensor if the computed ratio value decreases, and detecting the direction of movement from the second sensor toward the first sensor if the computed ratio value increases; and a drive control unit controlling the driving of an opening and closing body in accordance with the detected direction of movement.

7 Claims, 9 Drawing Sheets

(51) Int. Cl.
  *E05B 81/76* (2014.01)
  *H03K 17/955* (2006.01)
  *G06F 3/044* (2006.01)
(52) U.S. Cl.
  CPC ........... *E05B 81/76* (2013.01); *H03K 17/955* (2013.01); *E05B 81/77* (2013.01); *G06F 3/044* (2013.01); *H03K 2217/94036* (2013.01); *H03K 2217/94052* (2013.01); *H03K 2217/96058* (2013.01); *H03K 2217/96078* (2013.01)

(56) References Cited

U.S. PATENT DOCUMENTS

2010/0204953 A1* 8/2010 Onishi .................. G06F 3/0304
                                                    702/150
2015/0360646 A1   12/2015 Pribisic et al.

FOREIGN PATENT DOCUMENTS

| JP | 2005-307692 A | 11/2005 |
| JP | 2009-018655 A | 1/2009 |

* cited by examiner

VEHICULAR OPERATION DETECTING APPARATUS

CROSS REFERENCE TO RELATED APPLICATIONS

This application is based on and claims priority under 35 U.S.C. § 119 to Japanese Patent Application 2016-033461, filed on Feb. 24, 2016, the entire contents of which are incorporated herein by reference.

TECHNICAL FIELD

This disclosure relates to a vehicular operation detecting apparatus that detects an operation related to an opening and closing body.

BACKGROUND DISCUSSION

In the related art, a vehicular power back door automatic opening and closing system disclosed in JP-2005-307692A (Reference 1) and a control apparatus and a method disclosed in JP-2009-18655A (Reference 2) are known as vehicular operation detecting apparatuses.

According to Reference 1, a user's motion of touching a capacitive sensor, which is installed in a vehicle, with a part (a finger or the like) of the body is a motion to demand the opening and closing of a back door. Specifically, the sensor includes two touch sensors. For example, the direction of a demanded operation of the back door is determined based on a sequence (time difference) in which the user touches the two touch sensors.

Similarly, according to Reference 2, an operation performed by a user such as brining various objects close to or moving various objects away from a predetermined location is detected (determined), and various functions of a vehicle are enabled in accordance with a detection result.

According to Reference 1, based on a magnitude relationship between a capacitance-related pulse signal generated and output by each touch sensor and a predetermined threshold value, it is determined whether a human's (user's) motion occurs. Accordingly, a sequence in which the user touches the two touch sensors is determined by a timing when the magnitude relationship between the pulse signals of both the touch sensors and the predetermined threshold value is inversed. If there is a variation in sensitivity between both the touch sensors due to effects of product tolerances or environmental changes, that is, if the sensitivities of both the touch sensors are not equal to each other, there is a possibility of erroneously determining the aforementioned sequence. This also applies to Reference 2. Hereinafter, this will be specifically described.

FIG. 15 illustrates a state in which a user moves a part (finger H or the like) of the body along a direction in which sensor electrodes 91, 92, and 93 of three touch sensors are provided side by side in the listed sequence. In FIGS. 16A to 16C, progressions of detection signals S91, S92, and S93, which correspond to pulse signals and are generated and output by the sensor electrodes 91 to 93 in accordance with a user's motion, are illustrated together with a threshold value Sth for determination of a magnitude relationship therebetween.

As illustrated in FIG. 16A, if sensitivities of the sensor electrodes 91 to 93 are equal to each other, waveforms of the detection signals S91 to S93 are the same, and the detection signals S91 to S93 are generated in the listed sequence in accordance with the user's motion. Accordingly, time differences occur such that times (so-called threshold value off timings) t91, t92, and t93 when the detection signals S91 to S93 go below the threshold value Sth also occur in the sequence of the sensor electrodes 91 to 93. In other words, a user's motion (the direction of movement of the user's finger H) is determined by monitoring the sequence of the times t91, t92, and t93.

In contrast, as illustrated in FIG. 16B, even if the sensitivities of the sensor electrodes 91 to 93 are decreased in the listed sequence, similarly, detection signals S94, S95, and S96 are generated in the listed sequence in accordance with a user's motion. In contrast, the detection signals S94, S95, and S96 of the sensor electrodes 91 to 93 having relatively high sensitivities are generated in such a way as to contain the detection signals S94 to S96 of the sensor electrodes 91 to 93 having relatively low sensitivities. In this case, time differences occur such that the sequence of times t94, t95, and t96 when the detection signals S94 to S96 go below the threshold value Sth is inverse to the original sequence of the sensor electrodes 91 to 93. Accordingly, it is determined that a user's motion (the direction of movement of the user's finger H) is reversed to the original user's motion.

Alternatively, as illustrated in FIG. 16C, if the sensitivity of only the sensor electrode 92 is higher than those of the sensor electrodes 91 and 93, regardless of a user's motion, a detection signal S98 of the sensor electrode 92 is generated to contain detection signals S97 and S99 of the other sensor electrodes 91 and 93. In this case, among the times t97, t98, and t99 when the detection signals S97 to S99 go below the threshold value Sth, the time t99 is ahead of the time t98, and thus, the user's motion (the direction of movement of the user's finger H) cannot be determined.

Even if sensitivities of both touch sensors are equal to each other, since separation distances between a moving human (user) and both the touch sensors are not constant in a state where there is no contact between the moving man and both the touch sensors, there is the possibility of erroneously determining the aforementioned sequence. Hereinafter, more detailed description will be given.

FIG. 17A illustrates a state in which a user moves a part (for example, the finger H) of the body along one direction in which sensor electrodes 101 and 102 of two touch sensors are provided side by side in the listed sequence, while the posture of the part of the body is parallel to the one direction. In FIG. 17B, progressions of detection signals S101 and S102, which are generated and output by the sensor electrodes 101 and 102 in accordance with a user's motion, are illustrated together with the threshold value Sth for determination of a magnitude relationship therebetween.

As being apparent from the drawings, in this case, waveforms of the detection signals S101 and S102 are the same, and the detection signals S101 and S102 are generated in the listed sequence in accordance with the user's motion. Accordingly, time differences occur such that times t101 and t102 when the detection signals S101 and S102 go below the threshold value Sth also occur in the sequence of the sensor electrodes 101 and 102. As described above, a user's motion (the direction of movement of the user's finger H) is determined by monitoring the sequence of the times t101 and t102.

In contrast, FIG. 18A illustrates a state in which a user brings a part (for example, the finger H) of the body close to two sensor electrodes 101 and 102 while the posture of the part of the body is inclined with respect to the aforementioned one direction, and then moves the part of the body away from the two sensor electrodes 101 and 102 (that is, a state in which the part of the body is not moved in the one direction and a direction opposite thereto). In FIG. 18B, progressions of detection signals S103 and S104, which are generated and output by the sensor electrodes 101 and 102 in accordance with a user's motion, are illustrated together with the threshold value Sth for determination of a magnitude relationship therebetween.

As being apparent from the drawings, in this case, the detection signals S103 and S104 are generated such that the detection signal S103 of the sensor electrode 101 having a relatively short separation distance from the user (the finger H) is higher than the detection signal S104 of the sensor electrode 102 having a long separation distance, and contains the detection signal S104. In this case, time differences occur such that, between times t103 and t104 when the detection signals S103 and S104 go below the threshold value Sth, the time t104 is ahead of the time t103. Accordingly, a motion (movement of the finger H in the direction opposite to the one direction) different from an actual user's motion is determined (erroneous determination).

SUMMARY

Thus, a need exists for a vehicular operation detecting apparatus which is not suspectable to the drawback mentioned above.

A vehicular operation detecting apparatus according to an aspect of this disclosure includes: a plurality of sensors which are provided side by side in a vehicle, and individually output detection signals that change when a detection target comes into contact with or approaches the plurality of sensors; a computing unit configured to compute a ratio value which is a value of a ratio of a first detection signal, which is a detection signal of a first sensor that is one of the sensors, to a second detection signal which is a detection signal of a second sensor that is another one of the sensors; an operational direction detection unit configured to detect a direction of movement of the detection target from the first sensor toward the second sensor if the computed ratio value decreases, and to detect the direction of movement of the detection target from the second sensor toward the first sensor if the computed ratio value increases; and a drive control unit configured to control the driving of an opening and closing body in accordance with the detected direction of movement.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Figure 1:
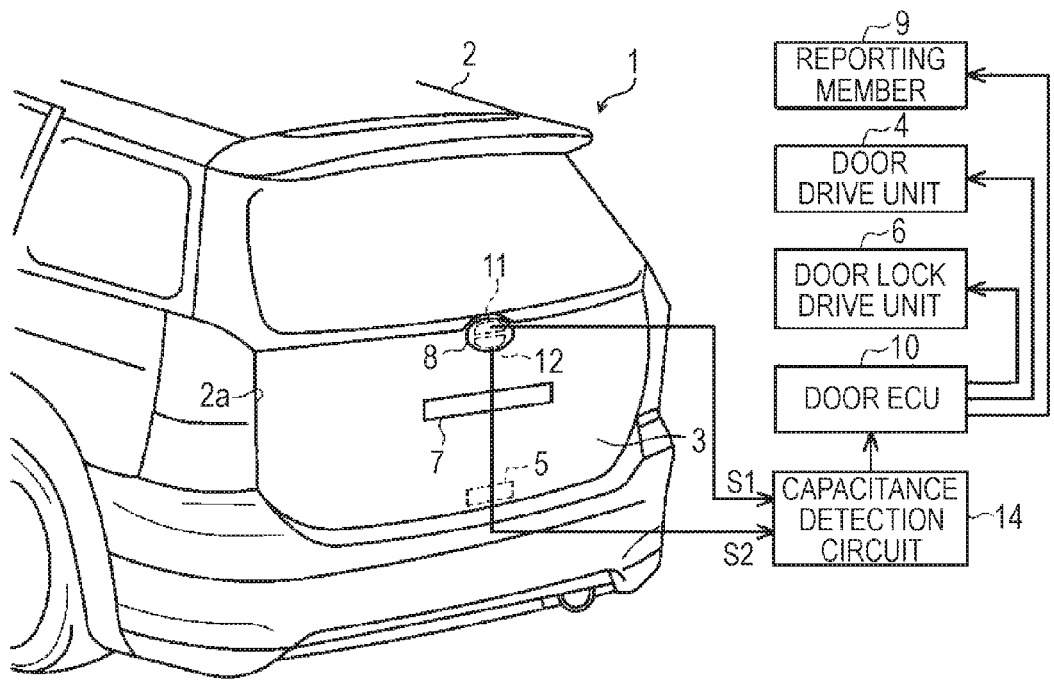
FIG. 1 is a perspective view illustrating the structure of a rear portion of a vehicle to which a vehicular operation detecting apparatus of an embodiment is applied.

Hereinafter, an embodiment of a vehicular operation detecting apparatus will be described. As illustrated in FIG. 1, an opening 2a is formed in a rear portion of a body 2 of a vehicle 1 such as an automobile. A back door 3 which is an opening and closing body is openably and closeably attached to the rear portion of the body 2 via a door hinge (not illustrated) provided in an upper portion of the opening 2a. A user opens the back door 3 by pushing the back door 3 upward around the door hinge. A door lock 5 is installed at an interior side tip end of the back door 3 such that the door lock 5 locks and unlocks the back door 3 in a closed state.

A door drive unit 4 is installed in the rear portion of the body 2. The door drive unit 4 includes an electrical drive source such as an electric motor as a main element. The door drive unit 4 is mechanically linked to the back door 3 via a suitable door drive mechanism such that the door drive unit 4 drives the opening and closing of the back door 3. A door lock drive unit 6 is installed in the back door 3 while being adjacent to the door lock 5. The door lock drive unit 6 includes an electrical drive source such as an electric motor as a main element. The door lock drive unit 6 is mechanically linked to the door lock 5 via a suitable lock drive mechanism such that the door lock drive unit 6 drives the locking and unlocking of the door lock 5.

The door drive unit 4 and the door lock drive unit 6 are electrically connected to a door electronic control unit (ECU) 10 including a microcomputer (MCU). The driving of the door drive unit 4 and the door lock drive unit 6 is individually controlled by the door ECU 10. The door ECU 10 is electrically connected to reporting members 9 such as an existing light emitting device (hazard flasher or the like), a separately built light emitting device (LED or the like), and a sound generation device such as a speaker. The door ECU 10 collectively controls the driving of the reporting members 9.

Figure 2:
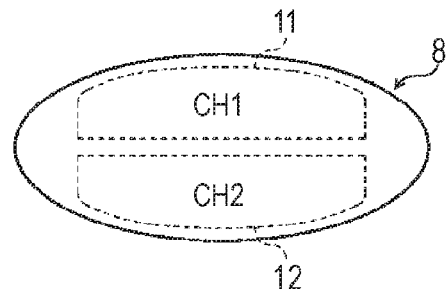
FIG. 2 is a front view illustrating the structure of the vehicular operation detecting apparatus of the embodiment.

An emblem 8 such as a company name is installed in a central portion (upper central portion of a garnish 7) of an exterior surface of the back door 3. As illustrated in FIG. 2, an upper electrode 11 and a lower electrode 12 of a capacitive sensor as an example of a plurality of sensors are installed on a back portion of the emblem 8. The upper electrode 11 is disposed in an upper portion of the emblem 8, and is molded into a substantially crescent shape conforming to an upper edge of the emblem 8. In contrast, the lower electrode 12 is disposed in a lower portion of the emblem 8, and is molded into a substantially crescent shape conforming to a lower edge of the emblem 8. It is needless to say that the upper electrode 11 and the lower electrode 12 are disposed spaced from each other in an upward and downward direction.

The upper electrode 11 and the lower electrode 12 are electrically connected to a capacitance detection circuit 14. The capacitance detection circuit 14 outputs oscillation signals to the upper electrode 11 and the lower electrode 12 such that the upper electrode 11 and the lower electrode 12 output detection signals S1 and S2 [V] of voltage levels according to capacitances thereof. The outputting of oscillation signals from the capacitance detection circuit 14 and the inputting of the detection signals S1 and S2, which correspond to the oscillation signals, into both the electrodes 11 and 12 may be simultaneously performed, or may be sequentially performed via switching in a short period of time.

Figure 4:
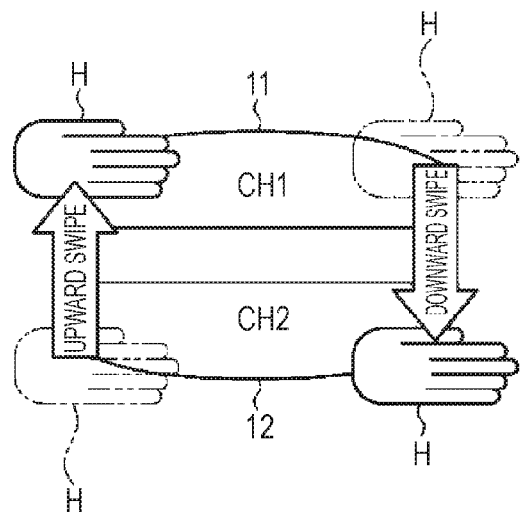
FIG. 4 is a view illustrating an operation for the vehicular operation detecting apparatus of the embodiment.

Accordingly, the detection signals S1 and S2, which are changed as a detection target (a human's finger or the like) comes into contact with and approaches the emblem 8, are individually output to the capacitance detection circuit 14 by the upper electrode 11 and the lower electrode 12 individually. The capacitance detection circuit 14 is electrically connected to the door ECU 10. A suitable normal operation related to the opening and closing of the back door 3 in the embodiment is a movement of a user's (human's) finger relative to the emblem 8. That is, as illustrated in FIG. 4, a user's motion (hereinafter, also referred to as an "upward swipe") in which a user moves the finger H from the lower electrode 12 toward the upper electrode 11 in the upward and downward direction represents an operation of opening the back door 3. In contrast, a user's motion (hereinafter, also referred to as a "downward swipe") in which a user moves the finger H from the upper electrode 11 toward the lower electrode 12 in the upward and downward direction represents an operation of closing the back door 3.

Figure 3:
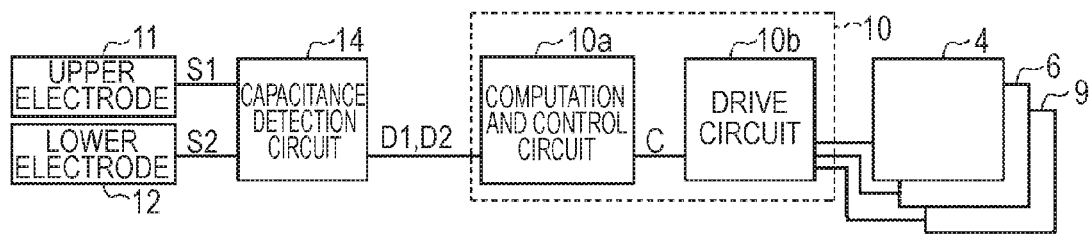
FIG. 3 is a block diagram illustrating the electrical configuration of the vehicular operation detecting apparatus of the embodiment.

As illustrated in FIG. 3, the door ECU 10 includes a computation and control circuit 10a and a drive circuit 10b. The door ECU 10 is electrically connected to the capacitance detection circuit 14 via the computation and control circuit 10a, and is electrically connected to the door drive unit 4, the door lock drive unit 6, and the reporting member 9 via the drive circuit 10b. The capacitance detection circuit 14 outputs detection data items D1 and D2, into which the detection signals S1 and S2 are converted via analog to digital (A-to-D) conversion, to the computation and control circuit 10a.

The computation and control circuit 10a executes various computational processes based on the detection data items D1 and D2, and outputs a control signal C to the drive circuit 10b in accordance with results of the computational processes. The drive circuit 10b drives the door drive unit 4, the door lock drive unit 6, and the reporting member 9 in accordance with the control signal C.

Figure 5:
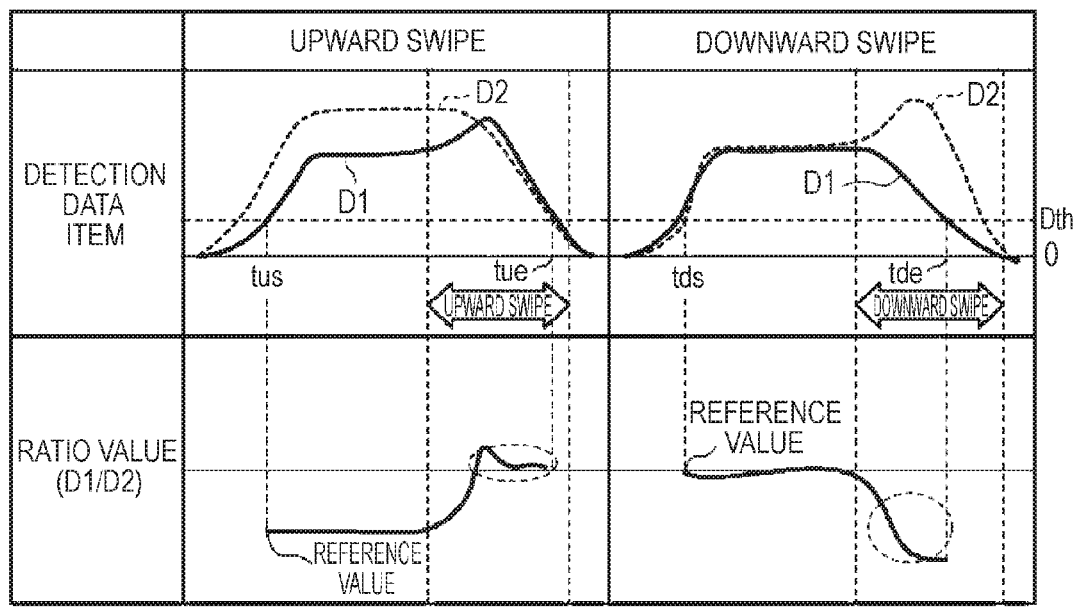
FIG. 5 is a time chart illustrating a mode of detecting an operation for the vehicular operation detecting apparatus of the embodiment.

Hereinafter, a mode of detecting an upward swipe and a downward swipe via the computation and control circuit 10a will be described. As illustrated in FIG. 4, if the user brings the finger H close to the emblem 8, and performs an upward swipe, the finger H is moved from the lower electrode 12 toward the upper electrode 11, and the finger H is brought close to the upper electrode 11, and then is moved away from the emblem 8. Accordingly, as illustrated in a left upper section of FIG. 5, along with the upward swipe in a state where both the detection data items D1 and D2 have risen up sufficiently, the detection data item D2 of the lower electrode 12 falls down, and the detection data item D1 of the upper electrode 11 rises up, and then falls down.

The computation and control circuit 10a determines whether both the detection data items D1 and D2 have exceeded a predetermined threshold value Dth (determination unit), and computes a ratio value Ra (=D1/D2) that is a value of the ratio of the detection data item D1 to the detection data item D2 in a time period (time tus to time tue) in which it is determined that both the detection data items D1 and D2 have exceeded the predetermined threshold value Dth (computing unit). As illustrated in a left lower section of FIG. 5, the ratio value Ra increases over time during the upward swipe as both the detection data items D1 and D2 progress as described above. If the ratio value Ra increases, the computation and control circuit 10a detects an upward swipe (the direction of movement of the detection target from a second sensor toward a first sensor) (operational direction detection unit).

More specifically, the computation and control circuit 10a stores the ratio value Ra at the time tus when both the data items D1 and D2 exceed the predetermined threshold value Dth in a memory as a reference value Ras, and computes a difference DRa (=Ra−Ras) between the ratio value Ra and the reference value Ras in the aforementioned period of time (time after the time tus). If the difference DRa is a positive number, the computation and control circuit 10a determines that the ratio value Ra is increasing.

Strictly speaking, if the ratio value Ra has increased by a predetermined increase determination value Rai (>0) from the reference value Ras, the computation and control circuit 10a determines that the ratio value Ra is increasing. That is, if the difference DRa (=Ra−Ras−Rai) between the ratio value Ra and a value obtained by adding the increase determination value Rai to the reference value Ras is a positive number, the computation and control circuit 10a determines that the ratio value Ra is increasing. In other words, even if the ratio value Ra has increased from the reference value Ras, if the increase does not satisfy the increase determination value Rai, the computation and control circuit 10a determines that the ratio value Ra is not increasing.

In contrast, as illustrated in FIG. 4, if the user brings the finger H close to the emblem 8, and performs a downward swipe, the finger H is moved from the upper electrode 11 toward the lower electrode 12, and the finger H is brought close to the lower electrode 12, and then is moved away from the emblem 8. Accordingly, as illustrated in a right upper section of FIG. 5, along with the downward swipe in a state where both the detection data items D1 and D2 have risen up sufficiently, the detection data item D1 of the upper electrode 11 falls down, and the detection data item D2 of the lower electrode 12 rises up, and then falls down.

The computation and control circuit 10a computes the ratio value Ra (=D1/D2) that is a value of the ratio of the detection data item D1 to the detection data item D2 in a time period (time tds to time tde) in which it is determined that both the detection data items D1 and D2 have exceeded the predetermined threshold value Dth (computing unit). As illustrated in a right lower section of FIG. 5, the ratio value Ra decreases over time during the downward swipe as both the detection data items D1 and D2 progress as described above. If the ratio value Ra decreases, the computation and control circuit 10a detects a downward swipe (the direction of movement of the detection target from the first sensor toward the second sensor) (operational direction detection unit).

More specifically, the computation and control circuit 10a stores the ratio value Ra at the time tds when both the detection data items D1 and D2 exceed the predetermined threshold value Dth in the memory as the reference value Ras, and computes the difference DRa (=Ra−Ras) between the ratio value Ra and the reference value Ras in the aforementioned period of time (time after the time tds). If the difference DRa is a negative number, the computation and control circuit 10a determines that the ratio value Ra is decreasing.

Strictly speaking, if the ratio value Ra has decreased by a predetermined decrease determination value Rad (>0) from the reference value Ras, the computation and control circuit 10a determines that the ratio value Ra is decreasing. That is, if the difference DRa (=Ra−Ras+Rad) between the ratio value Ra and a value obtained by subtracting the decrease determination value Rad from the reference value Ras in the aforementioned period of time is a negative number, the computation and control circuit 10a determines that the ratio value Ra is decreasing. In other words, even if the ratio value Ra has decreased from the reference value Ras, if the decrease does not satisfy the decrease determination value Rad, the computation and control circuit 10a determines that the ratio value Ra is not decreasing.

Hereinafter, the mode of detecting an upward swipe and a downward swipe via the computation and control circuit 10a will be collectively described with reference to a flowchart. A process is repeatedly executed at predetermined time intervals by a scheduled interruption.

Figure 6:
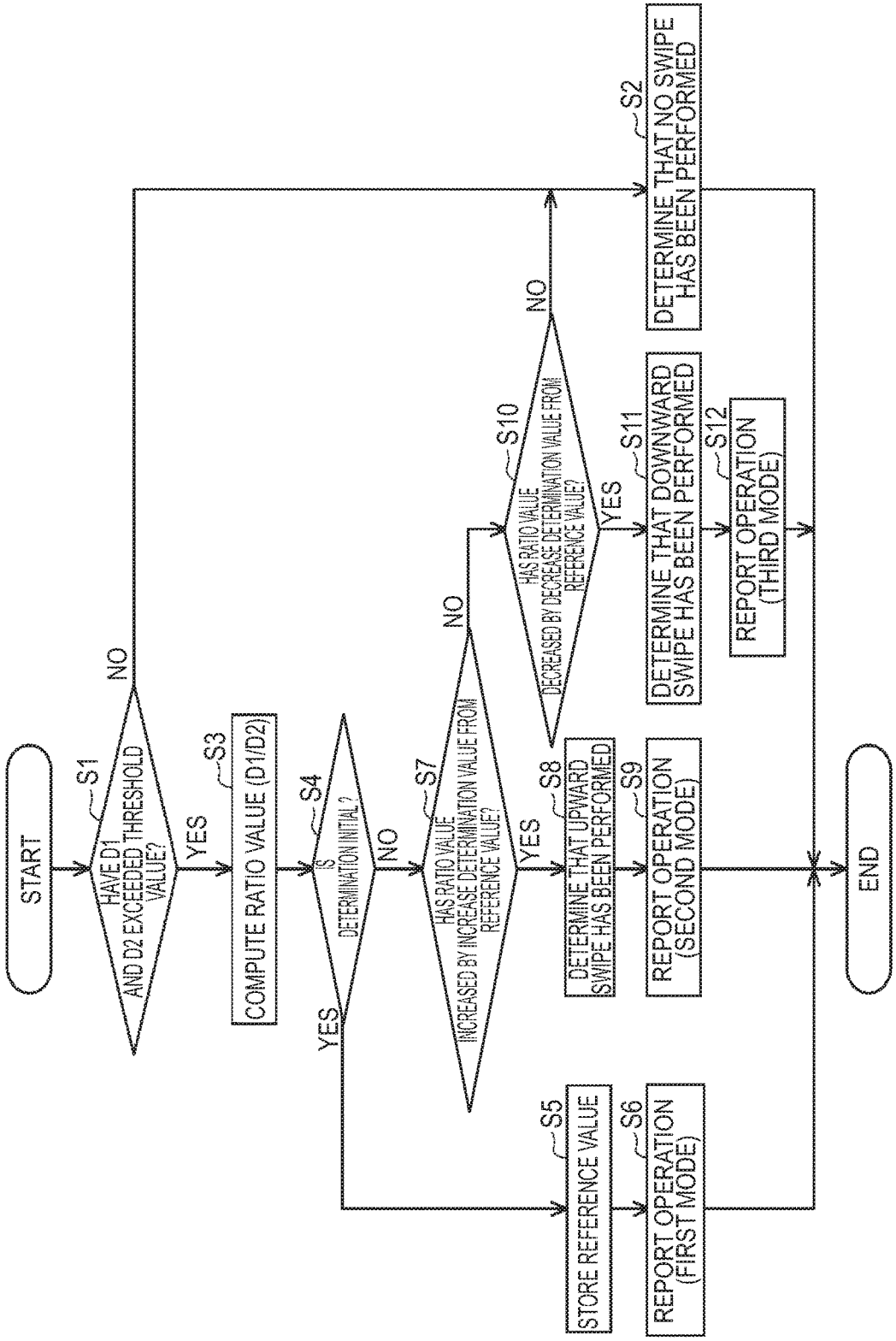
FIG. 6 is a flowchart illustrating the mode of detecting the operation for the vehicular operation detecting apparatus of the embodiment.

As illustrated in FIG. 6, if the process proceeds to a routine, the computation and control circuit 10a determines whether both the detection data items D1 and D2 have exceeded the predetermined threshold value Dth (Step S1). If it is determined that both the detection data items D1 and D2 have not exceeded the predetermined threshold value Dth (that is, at least one of the detection data items D1 and D2 has not exceeded the predetermined threshold value Dth), the computation and control circuit 10a determines that swipes (upward swipe and downward swipe) have not been performed (Step S2), and ends the process.

In contrast, if it is determined that both the detection data items D1 and D2 have exceeded the predetermined threshold value Dth (Step S1: YES), the computation and control circuit 10a computes the ratio value Ra that is a value of the ratio of the detection data item D1 to the detection data item D2 in a current cycle (Step S3). The computation and control circuit 10a determines whether the determination is an initial determination, that is, whether switching to the determination has been made in a current computational cycle (Step S4). If the determination is determined to be an initial determination, the computation and control circuit 10a stores the ratio value Ra of the current cycle in a built-in memory as the reference value Ras (Step S5). The computation and control circuit 10a controls the driving of the reporting member 9 in a suitable mode (first mode) in order for the reporting member 9 to report that the approach of the detection target (finger H) has been detected (Step S6), and ends the process. Accordingly, the computing and storing of the reference value Ras at timings (equivalent to the times tus and tds) when it is newly determined that both the detection data items D1 and D2 have exceeded the predetermined threshold value Dth is complete by going through the process.

If it is determined that the determination is not an initial determination (Step S4: NO), the computation and control circuit 10a determines whether the ratio value Ra of a current cycle has increased by the predetermined increase determination value Rai (>0) from the reference value Ras (Step S7). That is, the computation and control circuit 10a determines whether the difference DRa (=Ra−Ras−Rai) between the ratio value Ra and a value obtained by adding the increase determination value Rai to the reference value Ras is a positive number. If it is determined that the ratio value Ra has increased by the increase determination value Rai from the reference value Ras, the computation and control circuit 10a considers that there is an increase in the ratio value Ra, and determines that an upward swipe of moving the finger H from the lower electrode 12 toward the upper electrode 11 has been performed (Step S8). The computation and control circuit 10a controls the driving of the reporting member 9 in a suitable mode (second mode) in order for the reporting member 9 to report that the upward swipe has been established (Step S9), and ends the process.

In contrast, if it is determined that the ratio value Ra has not increased by the increase determination value Rai from the reference value Ras (Step S7: NO), the computation and control circuit 10a determines whether the ratio value Ra has decreased by the decrease determination value Rad (>0) from the reference value Ras (Step S10). That is, the computation and control circuit 10a determines whether the difference DRa (=Ra−Ras+Rad) between the ratio value Ra and a value obtained by subtracting the decrease determination value Rad from the reference value Ras is a negative number. If it is determined that the ratio value Ra has decreased by the decrease determination value Rad from the reference value Ras, the computation and control circuit 10a considers that there is a decrease in the ratio value Ra, and determines that a downward swipe of moving the finger H from the upper electrode 11 toward the lower electrode 12 has been performed (Step S11). The computation and control circuit 10a controls the driving of the reporting member 9 in a suitable mode (third mode) in order for the reporting member 9 to report that the downward swipe has been established (Step S12), and ends the process.

If it is determined that the ratio value Ra has not decreased by the decrease determination value Rad from the reference value Ras (Step S10: NO), the computation and control circuit 10a determines that the aforementioned swipes (upward swipe and downward swipe) have not been performed (Step S2), and ends the process. That is, if the ratio value Ra has not increased by the increase determination value Rai from the reference value Ras, and has not decreased by the decrease determination value Rad from the reference value Ras, similar to a case in which both the detection data items D1 and D2 do not exceed the predetermined threshold value Dth, it is determined that swipes have not been performed.

If it is determined that an upward swipe has been performed, the computation and control circuit 10a outputs the control signal C to the drive circuit 10b so as to open the back door 3, or if it is determined that a downward swipe has been performed, the computation and control circuit 10a outputs the control signal C to the drive circuit 10b so as to close the back door 3.

Hereinafter, an operation and effects of the embodiment will be described.

(1) In the embodiment, instead of using the detection data items D1 and D2, the ratio value Ra (=D1/D2) representing a relative increase or decrease is used to detect an upward swipe or a downward swipe (the direction of movement of a detection target) via the computation and control circuit 10a. For this reason, even if there is a variation in sensitivity between the upper electrode 11 and the lower electrode 12 due to effects of product tolerances or environmental changes, it is possible to detect an upward swipe or a downward swipe in a state where the variation is absorbed in advance. In contrast, if the finger H is moved in a direction (direction perpendicular to a wide surface of the emblem 8) perpendicular to a direction in which the upper electrode 11 and the lower electrode 12 are provided side by side, the detection data items D1 and D2 increase or decrease, but there is a slight or no increase or decrease in the ratio value Ra regardless of the posture of the finger H. That is, even if the finger H is brought close to the emblem 8, unless the finger H is moved in the direction (upward and downward direction) in which the upper electrode 11 and the lower electrode 12 are provided side by side, there is a slight or no increase or decrease in the ratio value Ra. For this reason, it is possible to further reduce the possibility of erroneously detecting the movement as an upward swipe or a downward swipe. In other words, even if a separation distance between the finger H and the upper electrode 11 is different from that between the finger H and the lower electrode 12 due to the posture of the finger H, it is possible to more accurately detect an upward swipe or a downward swipe.

(2) In the embodiment, it is possible to further improve the accuracy of detection of an upward swipe or a downward swipe by computing the ratio value Ra for detection of the upward swipe or the downward swipe based on the detection data items D1 and D2 which exceed the threshold value Dth and by which a sufficient S/N ratio is ensured.

(3) In the embodiment, a determination of an increase in the ratio value Ra via the computation and control circuit 10a is performed based on the fact that the difference DRa (=Ra−Ras−Rai) between the ratio value Ra and a value obtained by adding the increase determination value Rai of the ratio value Ra thereafter to the reference value Ras is a positive number. A determination of a decrease in the ratio value Ra via the computation and control circuit 10a is performed based on the fact that the difference DRa (=Ra−Ras+Rad) between the ratio value Ra and a value obtained by subtracting the decrease determination value Rad of the ratio value Ra thereafter from the reference value Ras is a negative number. Accordingly, it is possible to detect an increase or a decrease in the ratio value Ra, that is, an upward swipe or a downward swipe via a very simple technique that is based on whether the difference (difference between a ratio value at a time and a ratio value at another time thereafter) DRa between the ratio values Ra at two different times is a positive number or a negative number.

(4) In the embodiment, if an increase in the ratio value Ra from the reference value Ras does not reach the increase determination value Rai, and a decrease in the ratio value Ra from the reference value Ras does not reach the decrease determination value Rad, a determination of an increase and a decrease is avoided. That is, a range in which an increase in the ratio value Ra from the reference value Ras does not reach the increase determination value Rai, and a decrease in the ratio value Ra from the reference value Ras does not reach the decrease determination value Rad is set as a dead band of a determination of an increase and a decrease. Accordingly, it is possible to prevent an upward swipe or a downward swipe from being frequently detected whenever the difference between the ratio value Ra switches between a positive number and a negative number due to effects of external disturbances.

(5) In the embodiment, even if the flowing downward of water over the emblem 8 due to rainfall or the like is erroneously detected as a downward swipe, it is possible to avoid at least the opening of the back door 3 by limiting a downward swipe to an operation of closing the back door 3, and an upward swipe to an operation of opening the back door 3.

The embodiment may be changed in the following manner.

Figure 7:
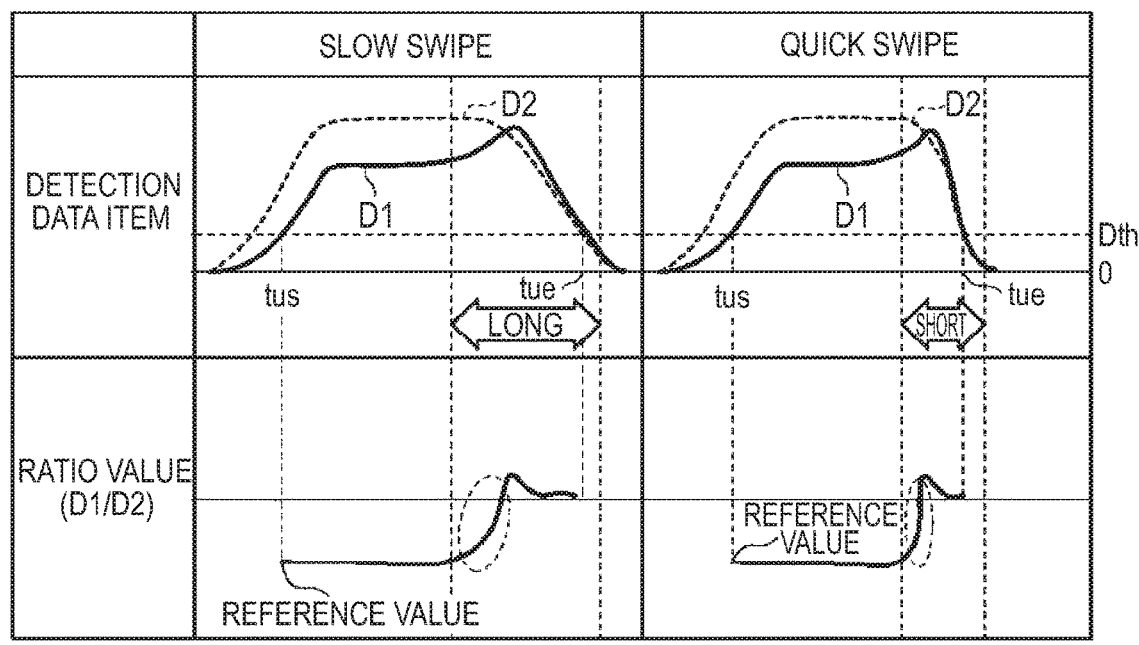
FIG. 7 is a time chart illustrating a mode of detecting an operation for the vehicular operation detecting apparatus of a modification embodiment.

As illustrated in FIG. 7, the speed (the movement speed of a detection target) of an upward swipe may be detected based on a time differential value (inclination) ΔRa of the ratio value Ra (operation speed detection unit). That is, as illustrated by a dotted circle in a left section of FIG. 7, in a relative slow upward swipe, the ratio value Ra also increases gently, and the time differential value ΔRa also decreases. In contrast, as illustrated by a dotted circle in a right section of FIG. 7, in a relatively quick upward swipe, the ratio value Ra also increases steeply, and the time differential value ΔRa also increases. As such, it is possible to detect the speed of an upward swipe based on the time differential value ΔRa of the ratio value Ra.

The speed (the movement speed of a detection target) of a downward swipe may be also detected based on the time differential value ΔRa of the ratio value Ra (operation speed detection unit). In this case, in a relatively slow downward swipe, the ratio value Ra decreases gently, and the magnitude (absolute value) of the time differential value ΔRa also decreases. In contrast, in a relatively quick downward swipe, the ratio value Ra also decreases steeply, and the magnitude (absolute value) of the time differential value ΔRa also increases. As such, it is possible to detect the speed of a downward swipe based on the time differential value ΔRa of the ratio value Ra.

The time differential value ΔRa may be an actual time differential value of the ratio value Ra. Alternatively, the time differential value ΔRa may be a value obtained by dividing a value, which is obtained by subtracting the ratio value Ra of a previous computation cycle (for example, last computational cycle) from the ratio value Ra of a computational cycle, by a time difference between both the computational cycles. Alternatively, the time differential value ΔRa may be a value obtained by subtracting the ratio value Ra of a previous computational cycle (for example, last computational cycle) from the ratio value Ra of a computational cycle. The reason for this is that if there is a time difference between the acquisitions of the ratio values Ra, a difference between the ratio values Ra contains a time element.

A relatively slow swipe (upward swipe or downward swipe) may represent an operation of opening or closing the back door 3 at a relatively slow drive speed. A relatively quick swipe may represent an operation of opening or closing the back door 3 at a relatively quick drive speed. In this case, the computation and control circuit 10*a* controls the drive speed (opening or closing speed) of the back door 3 in accordance with the speed of a detected upward swipe or downward swipe (drive control unit). That is, if the speed of a detected upward swipe or downward swipe is relatively quick, the computation and control circuit 10*a* outputs the control signal C to the drive circuit 10*b* so as to open or close the back door 3 at a relatively quick drive speed. Accordingly, if the speed of an upward swipe or a downward swipe is changed, it is possible to change the drive speed of the back door 3 in accordance with the changed speed.

The drive speed of the back door 3 may be linearly changed in accordance with the speed of an upward swipe or a downward swipe. Alternatively, an upward swipe or a downward swipe may be divided into a plurality of groups in accordance with the speed of the upward swipe or downward swipe, and the drive speed of the back door 3 may be changed in a stepwise manner in accordance with the affiliated groups.

Figure 8:
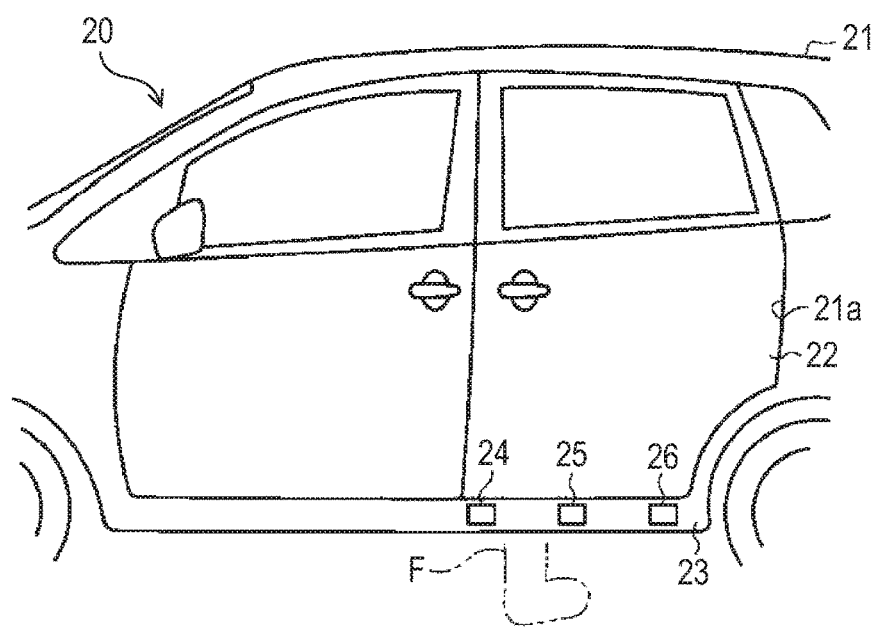
FIG. 8 is a side view illustrating the structure of a vehicle to which the vehicular operation detecting apparatus of the modification embodiment is applied.

As illustrated in FIG. 8, the embodiment may be applied to a vehicle 20 mounted with a slide door 22 which is moved in a forward and rearward direction such that an opening 21*a* formed in a lateral portion of a body 21 is opened and closed. In this case, a plurality of infrared sensors 24, 25, and 26 may be installed in a side skirt (also referred to as a "rocker cover") 23 extending along a lower edge of the opening 21*a* in the forward and rearward direction. The plurality of infrared sensors 24 to 26 may be installed inside of a side mud guard (not illustrated) extending along a lower edge of the slide door 22 in the forward and rearward direction. The infrared sensors 24 to 26 are provided side by side in the listed sequence from a front side to a rear side in the forward and rearward direction. Each of the infrared sensors 24 to 26 outputs a detection signal that changes when a detection target (for example, a human's foot F) comes into contact with or approaches a front surface of the side skirt 23. Accordingly, similar to the aforementioned embodiment, a process of determining an operational direction (the direction of movement of the detection target) is executed.

A suitable normal operation related to the opening and closing of the slide door 22 in the modification embodiment is a movement of the user's (human's) foot F relative to the side skirt 23. That is, a user's motion (hereinafter, also referred to as a "rearward swipe") in which a user moves the foot F rearward in the forward and rearward direction represents an operation of opening the slide door 22. A user's motion (hereinafter, also referred to as a "forward swipe") in which the user moves the foot F forward in the forward and rearward direction represents an operation of closing the slide door 22. A rearward swipe may represent an operation of opening the slide door 22 and an operation of unlocking the door lock 5 in accordance with the opening operation. In contrast, a forward swipe may represent an operation of closing the slide door 22 and an operation of locking the door lock 5 in accordance with the closing operation.

A reciprocating swipe including a rearward swipe and a forward swipe may represent an operation of setting an operation prevention period. Two forward swipes may represent an operation of setting and activating reservation of lock and blocking of the door. A relatively slow swipe (rearward swipe or forward swipe) may represent an operation of opening or closing the slide door 22 at a relatively slow drive speed. A relatively quick swipe may represent an operation of opening or closing the slide door 22 at a relatively quick drive speed.

Similar to the back door 3, the door ECU (10) controls the driving of the door drive unit (4) and the door lock drive unit (6) such that the slide door 22 is opened and closed.

The number of infrared sensors installed in the side skirt 23 may be set to an arbitrary number equal to or greater than two. A plurality of infrared sensors may be provided side by side in the side skirt 23 in the upward and downward direction. Instead of the plurality of infrared sensors, electrodes of a plurality of capacitive sensors, a plurality of optical sensors such as pyroelectric sensors, a plurality of ultrasonic sensors, a plurality of thermosensitive sensors, or the like may be adopted.

Figure 9A:
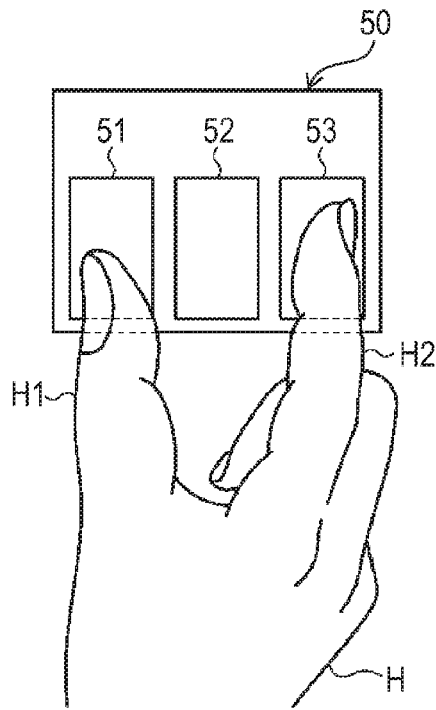
FIGS. 9A and 9B are front views illustrating the structure of the vehicular operation detecting apparatus of the modification embodiment.
Figure 9B:
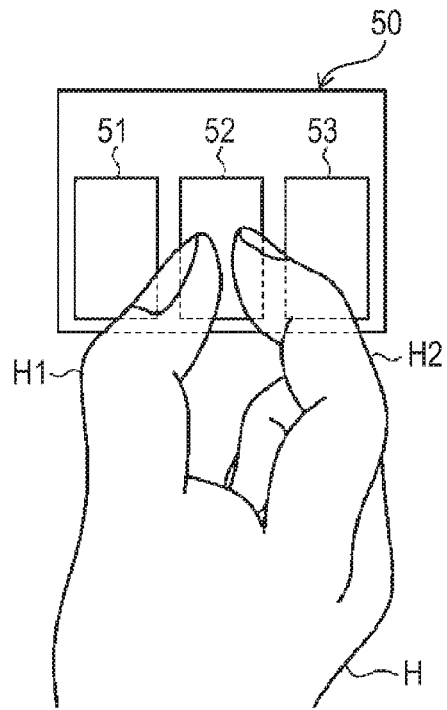

As illustrated in FIGS. 9A and 9B, if an overhead console 50 which is an interior operation panel over an occupant's head is mounted, electrodes 51, 52, and 53 of a plurality of capacitive sensors may be provided side by side in the overhead console 50. Each of the electrodes 51 to 53 outputs a detection signal that changes when a detection target (for example, the human's finger H) comes into contact with or approaches a front surface of the overhead console 50. Accordingly, similar to the aforementioned embodiment, a process of determining an operational direction (the direction of movement of the detection target) is executed.

A suitable normal operation of the modification embodiment related to the opening and closing of a sunroof (not illustrated) is a movement of the user's (human's) finger H relative to the overhead console 50. That is, an operation of opening the sunroof is represented by an operation of moving one finger (for example, a thumb) H1 from the central electrode 52 toward the left-end electrode 51 and moving the other finger (for example, a forefinger) H2 from the central electrode 52 toward the right-end electrode 53, that is, a so-called pinch of moving the fingers H1 and H2 away from each other. An operation of closing the sunroof is represented by an operation of moving the one finger H1 from the left-end electrode 51 toward the central electrode 52 and moving the other finger H2 from the right-end electrode 53 toward the central electrode 52, that is, a so-called pinch of moving the fingers H1 and H2 close to each other.

Similar to the back door 3, the door ECU (10) controls the driving of the door drive unit (4) such that the sunroof is opened and closed.

Figure 10:
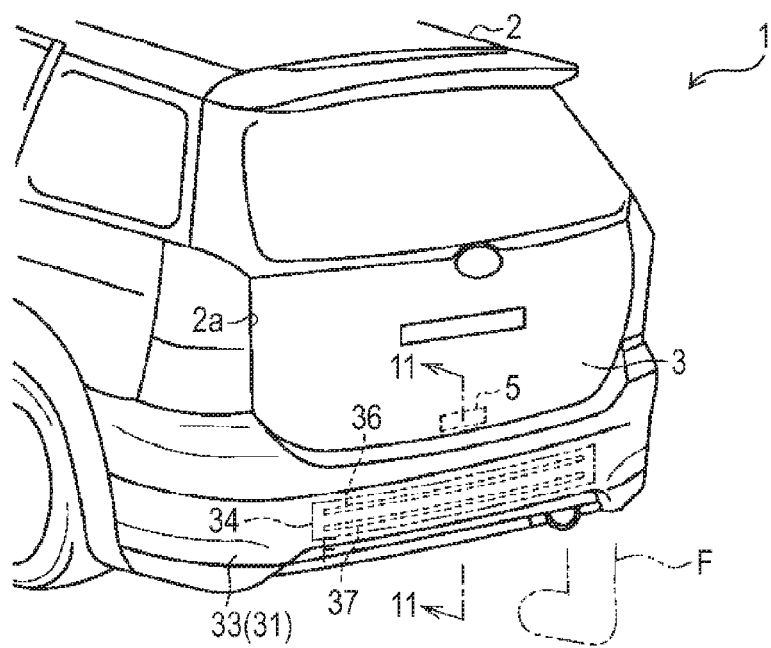
FIG. 10 is a perspective view illustrating the structure of a rear portion of a vehicle to which a vehicular operation detecting apparatus of a modification embodiment is applied.
Figure 11:
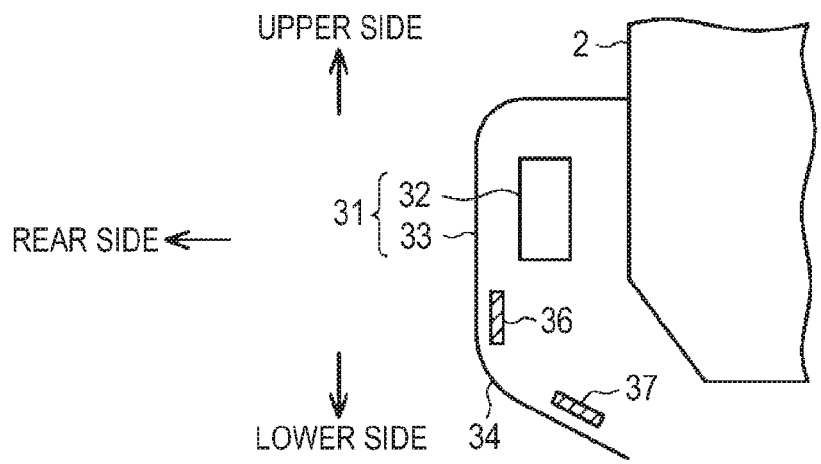
FIG. 11 is a sectional view taken along line XI-XI in FIG. 10.

As illustrated in FIG. 10, if a rear bumper 31 extending in a width direction of the vehicle is attached to a rear portion of the body 2 which is positioned below the back door 3, an upper electrode 36 and a lower electrode 37 of a plurality of capacitive sensors may be installed in the rear bumper 31. That is, as illustrated in FIG. 11, the rear bumper 31 includes a reinforcement 32 made of metal and a bumper cover 33 made of resin. The reinforcement 32 has the shape of a substantially long object which extends over substantially the entire length of the rear bumper 31 in the width direction of the vehicle. The bumper cover 33 covers the entirety of the reinforcement 32 from the rear side.

As illustrated in FIG. 10, each of the upper electrode 36 and the lower electrode 37 has the shape of a substantially belt which extends over substantially the entire length of the rear bumper 31 in the width direction of the vehicle. The upper electrode 36 and the lower electrode 37 have the same shape. The lower electrode 37 is disposed below the upper electrode 36 while a substantially predetermined gap is formed between the lower electrode 37 and the upper electrode 36. An operation input unit 34 having a substantially rectangular shape and including the upper electrode 36 and the lower electrode 37 is formed on a front surface (exterior surface) of the bumper cover 33. Each of the upper electrode 36 and the lower electrode 37 outputs a detection signal that changes when a detection target (for example, the human's foot F) comes into contact with or approaches the operation input unit 34. Accordingly, similar to the aforementioned embodiment, a process of determining an operational direction (the direction of movement of the detection target) is executed.

The number of sensor electrodes installed in the operation input unit 34 may be set to an arbitrary number equal to or greater than two. Alternatively, a plurality of sensor electrodes may be installed in the operation input unit 34 while being spaced from each other in the width direction of the vehicle. Instead of the plurality of sensor electrodes, a plurality of infrared sensors, a plurality of optical sensors such as pyroelectric sensors, a plurality of ultrasonic sensors, a plurality of thermosensitive sensors, or the like may be adopted. A suitable normal operation of the modification embodiment related to the opening and closing of the back door 3 is a movement of the user's (human's) foot F relative to the rear bumper 31 (operation input unit 34).

Figure 12:
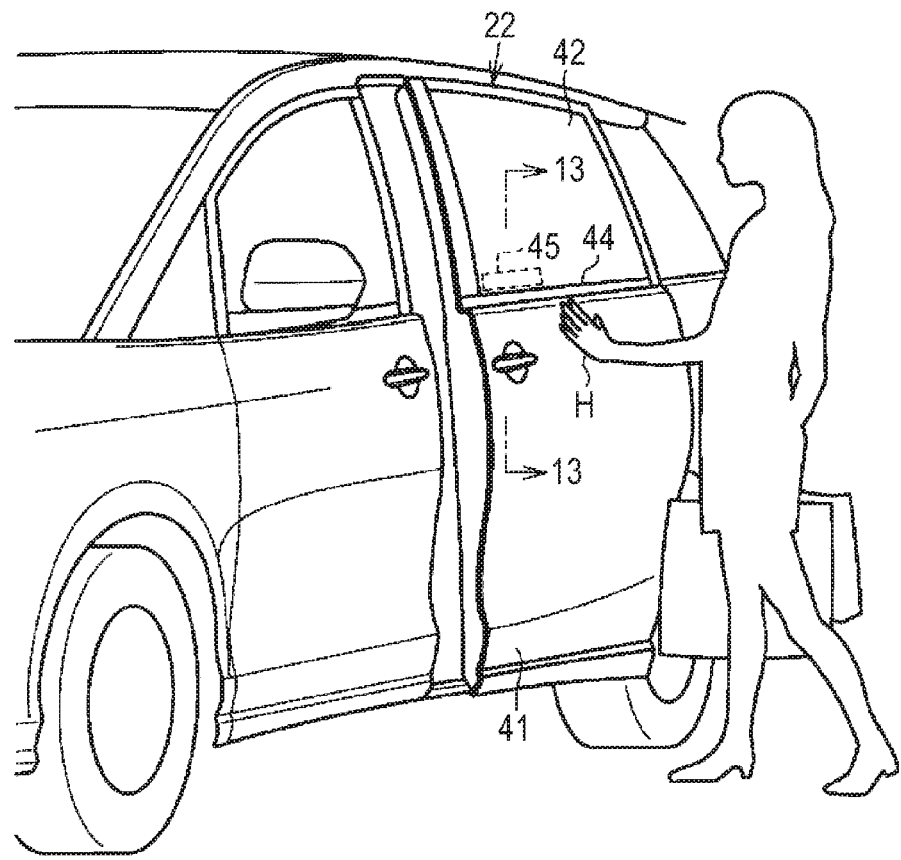
FIG. 12 is a perspective view illustrating the structure of a lateral portion of a vehicle to which a vehicular operation detecting apparatus of a modification embodiment is applied.
Figure 13:
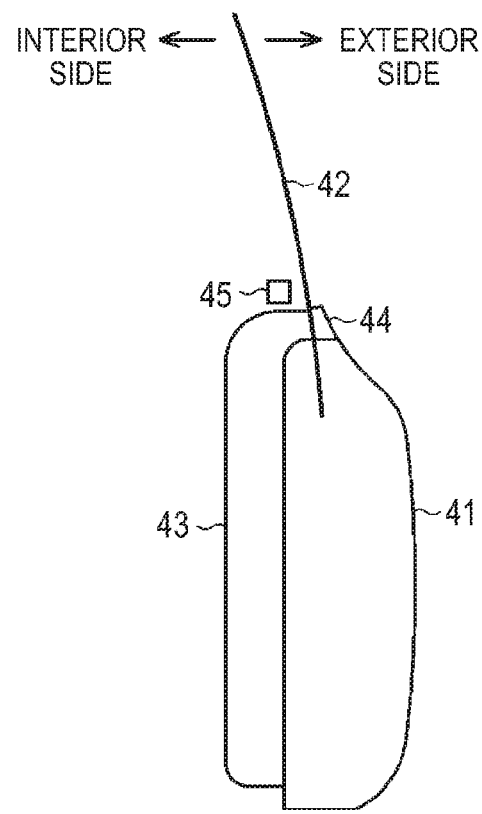
FIG. 13 is a sectional view taken along line XIII-XIII in FIG. 12.
Figure 14:
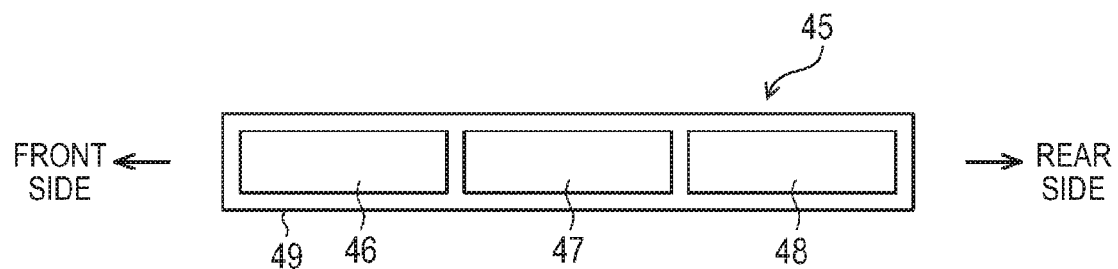
FIG. 14 is a front view illustrating the structure of the vehicular operation detecting apparatus of the modification embodiment.
Figure 15:
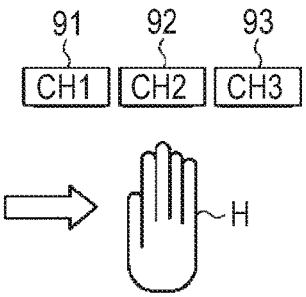
FIG. 15 is a view illustrating an operation for a vehicular operation detecting apparatus in the related art.
Figure 16A:
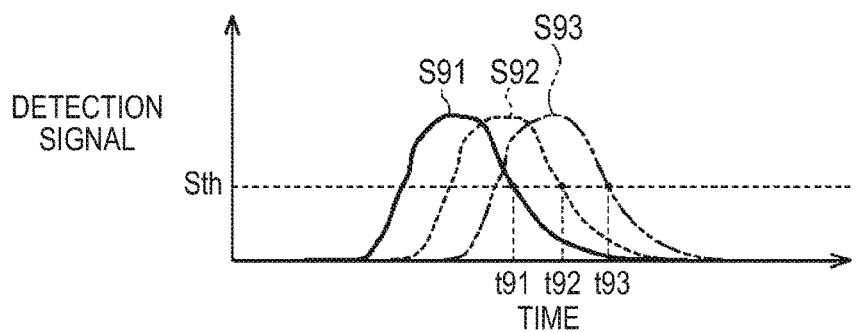
FIGS. 16A to 16C are time charts illustrating a mode of detecting an operation for the vehicular operation detecting apparatus in the related art.
Figure 16B:
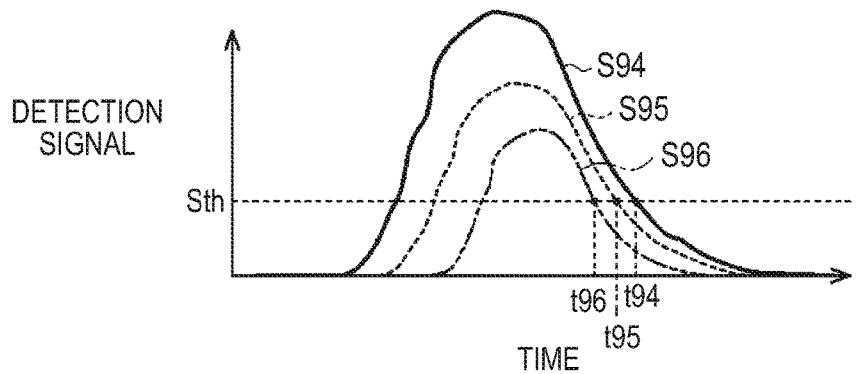
Figure 16C:
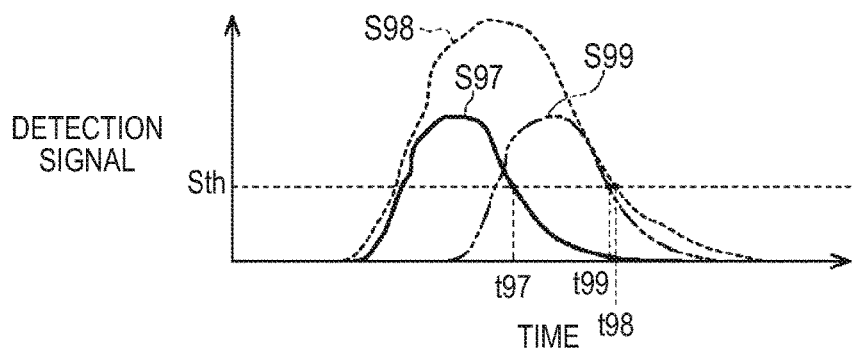
Figure 17A:
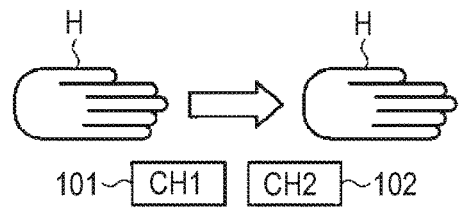
FIG. 17A is a view illustrating a normal operation for another vehicular operation detecting apparatus in the related art.
Figure 17B:
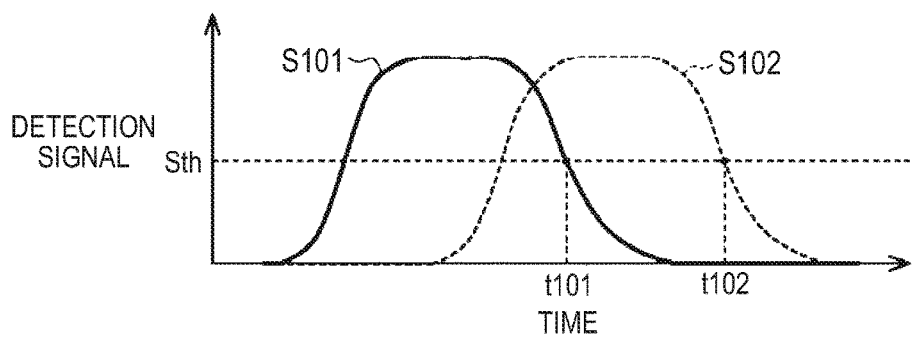
FIG. 17B is a time chart illustrating a mode of detecting the operation.
Figure 18A:
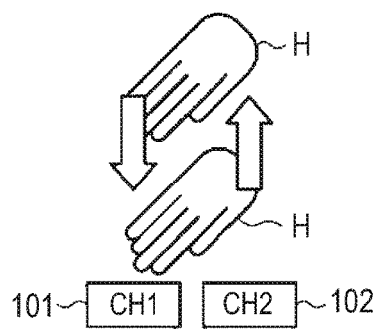
FIG. 18A is a view illustrating an operation which is performed in an inclined posture for the other vehicular operation detecting apparatus in the related art.
Figure 18B:
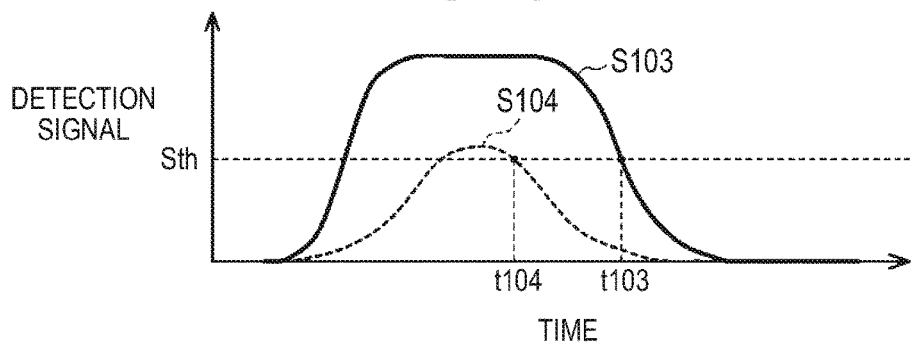
FIG. 18B is a time chart illustrating a mode of detecting the operation.

As illustrated in FIG. 12, in a case where window glass 42 advances from and retreats into a substantially bag-shaped door panel 41 of a lower portion of the slide door 22 in the upward and downward direction, a substantially strip-shaped sensor object 45 may be installed in the door panel 41 in the vicinity of the window glass 42. That is, as illustrated in FIG. 13, a door trim 43 forming interior design is attached to the door panel 41. A water-proof belt molding 44 is attached to an upper end of the door panel 41, and is in slide contact with an exterior surface of the window glass 42 that advances and retreats in the upward and downward direction. The sensor object 45 is mounted on the door trim 43 which is positioned closer to the interior side than the window glass 42. As illustrated in FIG. 14, the sensor object 45 includes a first electrode 46, a second electrode 47, and a third electrode 48 of a plurality of capacitive sensors which are disposed spaced from each other in the forward and rearward direction. The sensor object 45 includes a substrate 49 on which the first electrode 46, the second electrode 47, and the third electrode 48 are formed. Each of the first to third electrodes 46 to 48 outputs a detection signal that changes when a detection target (for example, the human's finger H) comes into contact with or approaches a front surface of the window glass 42 in the vicinity of the sensor object 45. Accordingly, similar to the aforementioned embodiment, a process of determining an operational direction (the direction of movement of the detection target) is executed.

A suitable normal operation of the modification embodiment related to the opening and closing of the slide door 22 is a movement of the user's (human's) finger H relative to the window glass 42. That is, an operation of opening the slide door 22 is represented by an operation of moving the finger H rearward in the forward and rearward direction. An operation of closing the slide door 22 is represented by an operation (forward swipe) of moving the finger H forward in the forward and rearward direction. A rearward swipe may represent an operation of opening the slide door 22 and an operation of unlocking the door lock 5 in accordance with the opening operation. In contrast, a forward swipe may represent an operation of closing the slide door 22 and an operation of locking the door lock 5 in accordance with the closing operation.

A reciprocating swipe including a rearward swipe and a forward swipe may represent an operation of setting an operation prevention period. Two forward swipes may represent an operation of setting and activating reservation of lock and blocking of the door. A relatively slow swipe (rearward swipe or forward swipe) may represent an operation of opening or closing the slide door 22 at a relatively slow drive speed. A relatively quick swipe may represent an operation of opening or closing the slide door 22 at a relatively quick drive speed.

The sensor object 45 may be built into the belt molding 44. The number of sensor electrodes of the sensor object 45 may be set to an arbitrary number equal to or greater than two. Alternatively, a plurality of sensor electrodes of the sensor object 45 may be provided spaced from each other in the upward and downward direction. Instead of the plurality of sensor electrodes, a plurality of infrared sensors, a plurality of optical sensors such as pyroelectric sensors, a plurality of ultrasonic sensors, a plurality of thermosensitive sensors, or the like may be adopted.

In the aforementioned embodiment, a determination of an increase or a decrease in the computed ratio value Ra is performed based on whether the time differential value (inclination) $\Delta Ra$ of the computed ratio value Ra is a positive or negative number. That is, if the time differential value $\Delta Ra$ computed for the time period (time tus to time tue) in which it is determined that both the detection data items D1 and D2 have exceeded the predetermined threshold value Dth is a positive number, the computation and control circuit 10$a$ determines that the ratio value Ra is increasing.

Strictly speaking, if a value ($=\Delta Ra-\Delta Rai$), which is obtained by subtracting a predetermined increase determination value $\Delta Rai$ ($>0$) from the time differential value $\Delta Ra$, is a positive number, the computation and control circuit 10$a$ determines that the ratio value Ra is increasing. In other words, even if the time differential value $\Delta Ra$ is a positive number, if the time differential value $\Delta Ra$ does not satisfy the increase determination value $\Delta Rai$, the computation and control circuit 10$a$ determines that the ratio value Ra is not increasing. As described above, if the ratio value Ra increases, an upward swipe (the direction of movement of a detection target from the second sensor toward the first sensor) is detected.

Similarly, if the time differential value $\Delta Ra$ computed for the time period (time tds to time tde) in which it is determined that both the detection data items D1 and D2 have exceeded the predetermined threshold value Dth is a negative number, the computation and control circuit 10$a$ determines that the ratio value Ra is decreasing.

Strictly speaking, if a value ($=\Delta Ra+\Delta Rad$), which is obtained by adding a predetermined decrease determination value $\Delta Rad$ ($>0$) to the time differential value $\Delta Ra$, is a negative number, the computation and control circuit 10$a$ determines that the ratio value Ra is decreasing. In other words, even if the time differential value $\Delta Ra$ is a negative number, if the time differential value $\Delta Ra$ does not satisfy the decrease determination value $\Delta Rad$, the computation and control circuit 10$a$ determines that the ratio value Ra is not decreasing. As described above, if the ratio value Ra decreases, a downward swipe (the direction of movement of a detection target from the first sensor toward the second sensor) is detected.

It is possible to obtain the following effects via the aforementioned changes.

(1) A determination of an increase in the ratio value Ra via the computation and control circuit 10$a$ is performed based on the fact that the value ($=\Delta Ra-\Delta Rai$), which is obtained by subtracting the predetermined increase determination value $\Delta Rai$ from the time differential value $\Delta Ra$, is a positive number. A determination of a decrease in the ratio value Ra via the computation and control circuit 10$a$ is performed based on the fact that the value (=ΔRa+ΔRad), which is obtained by adding the predetermined decrease determination value ΔRad to the time differential value ΔRa, is a negative number. Accordingly, it is possible to detect an increase or a decrease in the ratio value Ra, that is, an upward swipe or a downward swipe via a very simple technique that is based on whether the time differential value ΔRa is a positive number or a negative number.

(2) If the time differential value ΔRa does not reach the increase determination value ΔRai, and the time differential value ΔRa does not reach the decrease determination value ΔRad, a determination of an increase and a decrease is avoided. That is, a range in which the time differential value ΔRa does not reach the increase determination value ΔRai, and the time differential value ΔRa does not reach the decrease determination value ΔRad is set as a dead band of a determination of an increase and a decrease. Accordingly, it is possible to prevent an upward swipe or a downward swipe from being frequently detected whenever the time differential value ΔRa switches between a positive number and a negative number due to effects of external disturbances.

In the aforementioned embodiment, threshold values (Dth) for the detection data items D1 and D2 related to computation and determination of the ratio value Ra may individually set in accordance with the sensitivities of the detection data items D1 and D2.

In the aforementioned embodiment, a determination (Step S1) of a magnitude relationship between the detection data items D1 and D2 and the threshold value Dth, which is a prerequisite of computation of the ratio value Ra, may be omitted.

In the aforementioned embodiment, the ratio value Ra is computed using the detection data items D1 and D2 into which the detection signals S1 and S2 are converted via analog-to-digital conversion. Alternatively, the ratio value (Ra) may be computed as an analog value using the detection signals S1 and S2.

In the aforementioned embodiment, insofar as a plurality of sensors are provided side by side at positions at which do not bother a user about performing an operation, the plurality of sensors is arbitrarily disposed. If an operation target is the back door 3, a plurality of sensors may be provided on a front surface of the garnish 7. If an operation target is the slide door 22, a plurality of sensors may be provided on a front surface of a pillar or an outside door handle. In brief, a plurality of sensors may be disposed depending on an assumed detection target.

In the aforementioned embodiment, an upward swipe may represent an operation of opening the back door 3 and an operation of unlocking the door lock 5 in accordance with the opening operation. In contrast, a downward swipe may represent an operation of closing the back door 3 and an operation of locking the door lock 5 in accordance with the closing operation. A reciprocating swipe including a rearward swipe and a forward swipe may represent an operation of setting an operation prevention period. Two downward swipes may represent an operation of setting and activating reservation of lock and blocking of the door. Alternatively, a downward swipe (hereinafter, referred to as "lengthy holding") performed after holding the finger H at the position of the emblem 8 may represent an operation of setting and activating reservation of lock and blocking of the door.

It is possible to reduce the possibility of an erroneous operation by not operating the apparatus or performing a necessary prevention process if a motion other than operations determined in advance is detected.

In the aforementioned embodiment, the number of sensor electrodes installed in the emblem 8 is set to an arbitrary number equal to or greater than two. Alternatively, a plurality of sensor electrodes may be installed in the emblem 8 while being spaced from each other in the width direction of the vehicle.

In the aforementioned embodiment, insofar as a sensor is capable of outputting a detection signal that changes when a detection target comes into contact with or approaches the sensor, the sensor may be an infrared sensor, an optical sensor such as a pyroelectric sensor, an ultrasonic sensor, or a thermosensitive sensor.

In the aforementioned embodiment, an opening and closing operation target (opening and closing body) may be the window glass 42 (window regulator), a swing door, a bonnet, a trunk lid, a fuel lid, or the like. Alternatively, an operation target may be a rotating seat which can be rotated to support boarding and deboarding, a lifting seat which can be lifted upward and downward, or the like.

A vehicular operation detecting apparatus according to an aspect of this disclosure includes: a plurality of sensors which are provided side by side in a vehicle, and individually output detection signals that change when a detection target comes into contact with or approaches the plurality of sensors; a computing unit configured to compute a ratio value which is a value of a ratio of a first detection signal, which is a detection signal of a first sensor that is one of the sensors, to a second detection signal which is a detection signal of a second sensor that is another one of the sensors; an operational direction detection unit configured to detect the direction of movement of the detection target from the first sensor toward the second sensor if the computed ratio value decreases, and to detect the direction of movement of the detection target from the second sensor toward the first sensor if the computed ratio value increases; and a drive control unit configured to control the driving of an opening and closing body in accordance with the detected direction of movement.

According to this configuration, the ratio value is used to detect the direction of movement of the detection target via the operational direction detection unit. As a result, even if there is a variation in sensitivity between the first sensor and the second sensor due to effects of product tolerances or environmental changes, it is possible to detect the direction of movement of the detection target in a state where the variation is absorbed in advance. In contrast, if the detection target is moved in a direction perpendicular to a direction in which the first sensor and the second sensor are provided side by side, the first detection signal and the second detection signal increase or decrease, but there is a slight or no increase or decrease in the computed ratio value. For this reason, it is possible to further reduce the possibility of erroneously detecting the movement as one of the directions of movement of the detection target.

It is preferable that the vehicular operation detecting apparatus further includes a determination unit configured to determine whether each of the first detection signal and the second detection signal has exceeded a predetermined threshold value, and when the determination unit determines that both the first detection signal and the second detection signal have exceeded the predetermined threshold value, the operational direction detection unit detects the direction of movement of the detection target based on an increase or a decrease in the computed ratio value.

According to this configuration, it is possible to further improve the accuracy of detection of the direction of movement of the detection target by causing the computing unit to compute the ratio value for detection of the direction of movement of the detection target based on the first detection signal and the second detection signal which exceed the predetermined threshold value and by which a sufficient S/N ratio is ensured.

In the vehicular operation detecting apparatus, it is preferable that a determination of an increase or a decrease in ratio value computed by the operational direction detection unit is performed based on whether a difference between a ratio value computed at one time and a ratio value computed at another time after the one time is a positive number or a negative number.

According to this configuration, it is possible to detect an increase or a decrease in the computed ratio value, that is, the direction of movement of the detection target via a very simple technique that is based on whether the difference between the ratio values computed at two different times is a positive number or a negative number.

In the vehicular operation detecting apparatus, it is preferable that a determination of an increase or a decrease in ratio value computed by the operational direction detection unit is performed based on whether a time differential value of the computed ratio value is a positive number or a negative number.

According to this configuration, it is possible to detect an increase or a decrease in the computed ratio value, that is, the direction of movement of the detection target via a very simple technique that is based on whether the time differential value of the computed ratio value is a positive number or a negative number.

It is preferable that the vehicular operation detecting apparatus further includes an operation speed detection unit configured to detect the movement speed of the detection target based on the time differential value of the computed ratio value, and the drive control unit preferably controls the drive speed of the opening and closing body in accordance with the detected movement speed.

According to this configuration, if the movement speed of the detection target is changed, it is possible to change the drive speed of the opening and closing body in accordance with the changed speed.

In the vehicular operation detecting apparatus, it is preferable that a determination of an increase in ratio value computed by the operational direction detection unit is performed based on the fact that a difference between the ratio value computed at the one time and a value, which is obtained by adding a predetermined increase determination value to the ratio value computed at the other time, is a positive number, and a determination of a decrease in ratio value computed by the operational direction detection unit is preferably performed based on the fact that a difference between the ratio value computed at the one time and a value, which is obtained by subtracting a predetermined decrease determination value from the ratio value computed at the other time, is a negative number.

According to this configuration, if an increase in the computed ratio value does not reach the predetermined increase determination value, and a decrease in the computed ratio value does not reach the predetermined decrease determination value, a determination of an increase and a decrease is avoided. That is, a range in which an increase in the computed ratio value does not reach the predetermined increase determination value, and a decrease in the computed ratio value does not reach the predetermined decrease determination value is set as a dead band of a determination of an increase and a decrease. Accordingly, it is possible to prevent the operational direction detection unit from frequently detecting the direction of movement of the detection target whenever the difference switches between a positive number and a negative number due to effects of external disturbances.

In the vehicular operation detecting apparatus, it is preferable that a determination of an increase in ratio value computed by the operational direction detection unit is performed based on the fact that a value, which is obtained by subtracting a predetermined increase determination value from the time differential value, is a positive number, and a determination of a decrease in ratio value computed by the operational direction detection unit is preferably performed based on the fact that a value, which is obtained by adding a predetermined decrease determination value to the time differential value, is a negative number.

According to this configuration, if the time differential value does not reach the predetermined increase determination value, and the time differential value does not reach the predetermined decrease determination value, a determination of an increase and a decrease in the computed ratio value is avoided. That is, a range in which the time differential value does not reach the predetermined increase determination value, and the time differential value does not reach the predetermined decrease determination value is set as a dead band of a determination of an increase and a decrease. Accordingly, it is possible to prevent the operational direction detection unit from frequently detecting the direction of movement of the detection target whenever the time differential value switches between a positive number and a negative number due to effects of external disturbances.

According to the aspect of this disclosure, it is possible to improve the accuracy of detection of an operation for an opening and closing body.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A vehicular operation detecting apparatus comprising:
a plurality of sensors which are provided side by side in a vehicle, and individually output detection signals that change when a detection target comes into contact with or approaches the plurality of sensors;
a computing unit configured to compute a ratio value which is a value of a ratio of a first detection signal, which is a detection signal of a first sensor that is one of the sensors, to a second detection signal which is a detection signal of a second sensor that is another one of the sensors;
an operational direction detection unit configured to detect a direction of movement of the detection target from the first sensor toward the second sensor if the computed ratio value decreases, and to detect the direction of movement of the detection target from the second sensor toward the first sensor if the computed ratio value increases; and a drive control unit configured to control the driving of an opening and closing body in accordance with the detected direction of movement.

2. The vehicular operation detecting apparatus according to claim 1, further comprising:
a determination unit configured to determine whether each of the first detection signal and the second detection signal has exceeded a predetermined threshold value,
wherein when the determination unit determines that both the first detection signal and the second detection signal have exceeded the predetermined threshold value, the operational direction detection unit detects the direction of movement of the detection target based on an increase or a decrease in the computed ratio value.

3. The vehicular operation detecting apparatus according to claim 1,
wherein a determination of an increase or a decrease in ratio value computed by the operational direction detection unit is performed based on whether a difference between a ratio value computed at one time and a ratio value computed at another time after the one time is a positive number or a negative number.

4. The vehicular operation detecting apparatus according to claim 1,
wherein a determination of an increase or a decrease in ratio value computed by the operational direction detection unit is performed based on whether a time differential value of the computed ratio value is a positive number or a negative number.

5. The vehicular operation detecting apparatus according to claim 1, further comprising:
an operation speed detection unit configured to detect the movement speed of the detection target based on the time differential value of the computed ratio value,
wherein the drive control unit controls the drive speed of the opening and closing body in accordance with the detected movement speed.

6. The vehicular operation detecting apparatus according to claim 3,
wherein a determination of an increase in ratio value computed by the operational direction detection unit is performed based on the fact that a difference between the ratio value computed at the one time and a value, which is obtained by adding a predetermined increase determination value to the ratio value computed at the other time, is a positive number, and
wherein a determination of a decrease in ratio value computed by the operational direction detection unit is performed based on the fact that a difference between the ratio value computed at the one time and a value, which is obtained by subtracting a predetermined decrease determination value from the ratio value computed at the other time, is a negative number.

7. The vehicular operation detecting apparatus according to claim 4,
wherein a determination of an increase in ratio value computed by the operational direction detection unit is performed based on the fact that a value, which is obtained by subtracting a predetermined increase determination value from the time differential value, is a positive number, and
wherein a determination of a decrease in ratio value computed by the operational direction detection unit is performed based on the fact that a value, which is obtained by adding a predetermined decrease determination value to the time differential value, is a negative number.

* * * * *